US008655291B2

(12) United States Patent
Agahi et al.

(10) Patent No.: US 8,655,291 B2
(45) Date of Patent: Feb. 18, 2014

(54) SYSTEM AND METHOD FOR DYNAMICALLY IMPROVING CALL CONNECTION

(75) Inventors: Darioush Agahi, Irvine, CA (US); Arumugam Govindswamy, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 13/169,952

(22) Filed: Jun. 27, 2011

(65) Prior Publication Data
US 2012/0020294 A1  Jan. 26, 2012

Related U.S. Application Data

(63) Continuation of application No. 12/041,944, filed on Mar. 4, 2008, now Pat. No. 7,970,427.

(60) Provisional application No. 60/895,777, filed on Mar. 20, 2007.

(51) Int. Cl.
*H04B 1/04* (2006.01)
*H04B 7/00* (2006.01)

(52) U.S. Cl.
USPC .............. 455/127.1; 455/522; 455/115.1

(58) Field of Classification Search
USPC .......... 455/39, 69, 522, 517, 127.1, 127.2, 455/115.1, 115.3
See application file for complete search history.

(56) References Cited

U.S. PATENT DOCUMENTS

| 5,299,226 | A | | 3/1994 | Schilling | |
| 5,715,527 | A | * | 2/1998 | Horii et al. | 455/126 |
| 6,477,358 | B1 | * | 11/2002 | Mader et al. | 455/91 |
| 6,950,636 | B2 | * | 9/2005 | Rozenblit et al. | 455/126 |
| 7,053,708 | B2 | * | 5/2006 | Nagamori et al. | 330/133 |
| 7,379,747 | B2 | * | 5/2008 | Yu | 455/522 |
| 7,558,539 | B2 | * | 7/2009 | Huynh et al. | 455/126 |

(Continued)

FOREIGN PATENT DOCUMENTS

JP  2002-261689  9/2002

OTHER PUBLICATIONS

Wern-Ho Sheen et al. "Burst synchronization of slotted random access with preamble power ramping in the reverse link of CDMA systems." Wireless Communications, IEEE Trans., vol. 2, Issue 5, Sep. 2003; pp. 953-963.

*Primary Examiner* — Sonny Trinh
(74) *Attorney, Agent, or Firm* — Knobbe Martens Olson & Bear, LLP

(57) ABSTRACT

A method for controlling an output of a power amplifier of a portable communication device includes determining a power level of a signal received at the portable communication device, generating a receive reference signal (RXLEV) that is indicative of the power level of the signal received at the portable communication device, and determining whether the receive reference signal is within a threshold value window. When the receive reference signal is within the threshold value window a nominal power output of a power amplifier in the portable communication device is transmitted during a random access channel signal transmission. When the receive reference signal is below the threshold value, a power output of the power amplifier in the portable communication device is increased during the random access channel signal transmission. When the receive reference signal is above the threshold value, a power output of the power amplifier in the portable communication device is decreased during the random access channel signal transmission.

20 Claims, 7 Drawing Sheets

(56) References Cited

U.S. PATENT DOCUMENTS

| | | |
|---|---|---|
| 7,650,122 B2 * | 1/2010 | Itkin et al. .................... 455/126 |
| 7,689,183 B2 | 3/2010 | Yan |
| 7,813,772 B2 * | 10/2010 | Camp et al. ................... 455/574 |
| 7,865,209 B2 * | 1/2011 | Kim et al. ..................... 455/522 |
| 7,894,376 B2 * | 2/2011 | Rofougaran .................. 370/311 |
| 8,014,359 B2 * | 9/2011 | Cave et al. .................... 370/332 |
| 8,289,931 B2 * | 10/2012 | Higuchi et al. ............... 370/335 |
| 2005/0254467 A1 | 11/2005 | Li et al. |
| 2005/0282574 A1 | 12/2005 | Li et al. |
| 2006/0246938 A1 * | 11/2006 | Hulkkonen et al. .......... 455/522 |
| 2008/0051126 A1 * | 2/2008 | Nagaraj et al. ............... 455/522 |

\* cited by examiner

SYSTEM AND METHOD FOR DYNAMICALLY IMPROVING CALL CONNECTION

CROSS-REFERENCE TO RELATED APPLICATIONS

This application is a continuation of U.S. patent application Ser. No. 12/041,944, filed on Mar. 4, 2008, entitled "SYSTEM AND METHOD FOR DYNAMICALLY IMPROVING CALL CONNECTION," which is a non-provisional application of U.S. Provisional Application No. 60/895,777, filed on Mar. 20, 2007, entitled "IMPROVING CALL CONNECTION DYNAMICALLY," the benefits of the filing dates of which are hereby claimed and the specifications of which are incorporated herein by this reference.

BACKGROUND

In a cellular-type communication system, a base station (BS) communicates with one or more mobile stations (MS) also referred to as a handset. To register with the base station or to establish a call with a base station in the Global System for Mobile Communication (GSM) system, the mobile station must initiate the process by sending a random access burst on what is referred to as random access channel (RACH). The random access burst is referred to as a "RACH" or a "RACH burst." When accessing the base station using a RACH, the mobile station operating in the GSM system must use the maximum transmit power that it is allowed when accessing the system. The GSM system includes a number of different communication bands which are deployed throughout the world including, for example, the GSM 850 band deployed in the Americas, the GSM 900 band deployed in Europe, the DCS 1800 band deployed in Europe and the PCS 1900 band deployed in the Americas.

For example, in a class 4 mobile station operating in the GSM 900 band, output power is divided into a number of levels with output power level 5 being the maximum power and corresponding to a 33 dBm, +/−2 dB nominally. This arrangement also applied to extended data rates for GSM evolution (EDGE), DCS and PCS systems.

In a GSM system, typically the maximum power the base station can transmit is approximately 43 dBm and the maximum power that a class 4 mobile station can transmit is 33 dBm, +/−2 dB. Other class mobile stations may have different maximum output power. The 10 dB difference in the downlink (base station to mobile station) versus the uplink (mobile station to base station) results in a transmission environment in which the mobile station is said to be "uplink limited," also referred to as a situation in which the mobile station is said to be "disadvantaged" with respect to the base station. Further, a mobile station can be uplink limited if it is distant from the base station or if the signal between the mobile station and the base station is highly attenuated by the propagation media. When the mobile station is in such a disadvantaged position, the 10 dB power difference may cause the mobile station to experience degradation in its call connection metric. A call connection metric is an important metric typically used by an equipment manufacturers and network operators to differentiate their brand against others.

Therefore, it would be desirable to have a way to minimize the influence of the uplink limited condition on the mobile station, and improve the call connection metric.

SUMMARY

Embodiments of the invention include a method for controlling an output of a power amplifier of a portable communication device, including determining a power level of a signal received at the portable communication device, generating a receive reference signal (RXLEV) that is indicative of the power level of the signal received at the portable communication device, and determining whether the receive reference signal is within a threshold value window. When the receive reference signal is within the threshold value window a nominal power output of a power amplifier in the portable communication device is transmitted during a random access channel signal transmission. When the receive reference signal is below the threshold value, a power output of the power amplifier in the portable communication device is increased during the random access channel signal transmission. When the receive reference signal is above the threshold value, a power output of the power amplifier in the portable communication device is decreased during the random access channel signal transmission.

Related systems are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
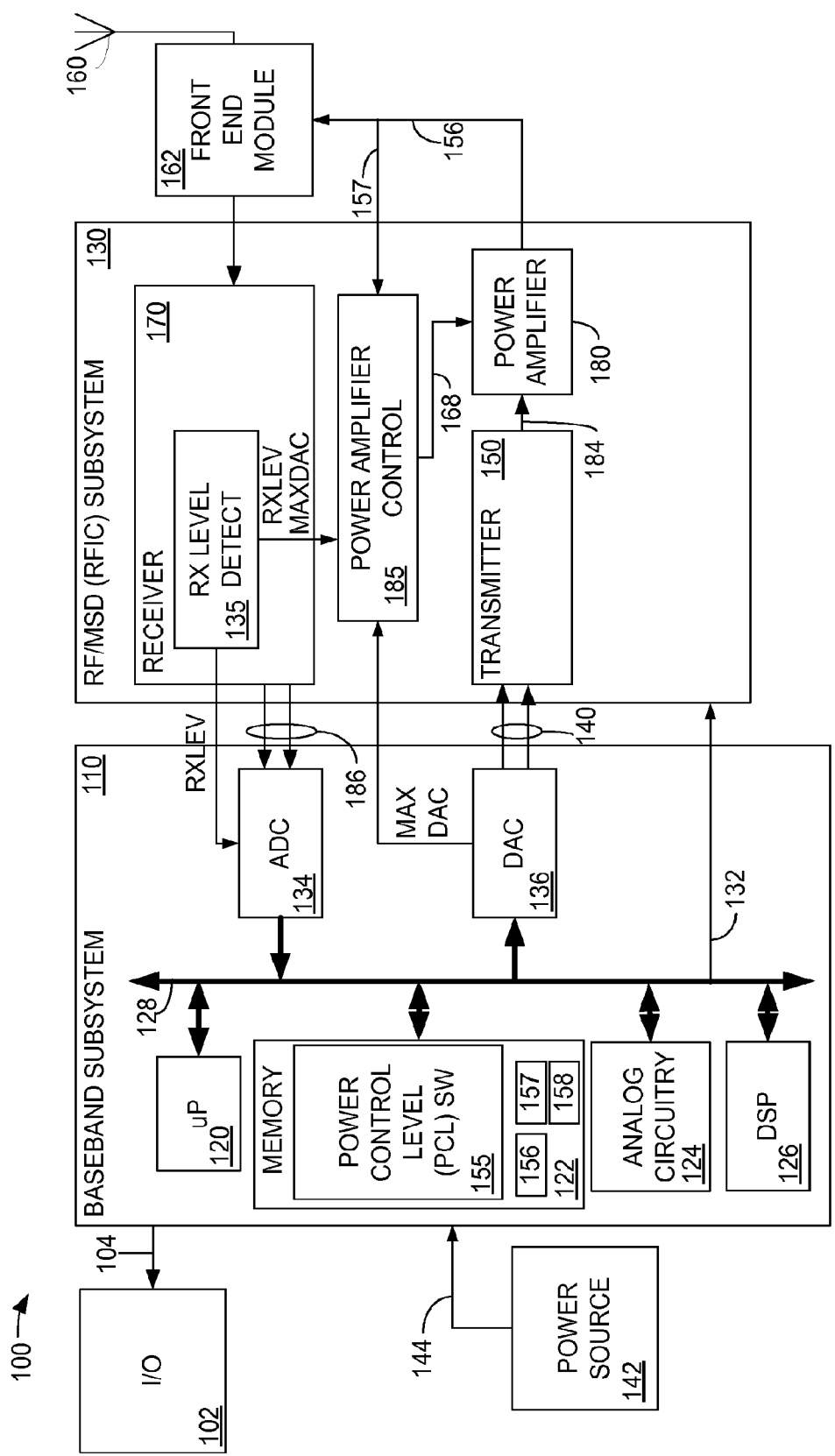
FIG. 1 is a block diagram illustrating a simplified portable transceiver including a power amplifier control element according to one embodiment of the system and method for dynamically improving call connection.

Although described with particular reference to a portable transceiver operating in the Global System for Mobile Communication (GSM) system, the system and method for dynamically improving call connection can be implemented in any communication device that accesses a random channel using maximum power to initiate a connection.

The system and method for dynamically improving call connection can be implemented in hardware, software, or a combination of hardware and software. When implemented in hardware, the system and method for dynamically improving call connection can be implemented using specialized hardware elements and logic. When the system and method for dynamically improving call connection is implemented partially in software, the software portion can be used to control components in the power amplifier control element so that various operating aspects can be software-controlled. The software can be stored in a memory and executed by a suitable instruction execution system (microprocessor). The hardware implementation of the system and method for dynamically improving call connection can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the system and method for dynamically improving call connection comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100 including an embodiment of a system and method for dynamically improving call connection. The portable transceiver 100 includes an input/output (I/O) element 102 coupled to a baseband subsystem 110 via connection 104. The I/O element 102 represents any interface with which a user may interact with the portable communication device 100. For example, the I/O element 102 may include a speaker, a display, a keyboard, a microphone, a trackball, a thumbwheel, or any other user-interface element. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone.

The baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the system and method for dynamically improving call connection is implemented, the baseband subsystem 110 may also include one or more of an application specific integrated circuit (ASIC), a field programmable gate array (FPGA), or any other implementation-specific or general processor.

Microprocessor 120 and memory 122 provide the signal timing, processing and storage functions for portable transceiver 100. Analog circuitry 124 provides the analog processing functions for the signals within baseband subsystem 110. The baseband subsystem 110 provides control signals a radio frequency (RF), mixed signal device (MSD) subsystem. 130. The RF/MSD subsystem 130 may include a transmitter 150, a receiver 170, power amplifier 180, and a power amplifier control element 185. The elements within the RF/MSD subsystem 130 can be controlled by signals from the baseband subsystem 110 via connection 132. Alternatively, the transmitter 150 and the receiver 170 may be located on an RF integrated circuit (IC).

The baseband subsystem 110 generates various control signals, such as a power control signal, that is used to control the power amplifier control element 185 and the power amplifier 180, as known to those skilled in the art. The control signals on connection 132 may originate from the DSP 126, the microprocessor 120, or from any other processor within the baseband subsystem 110, and are supplied to a variety of connections within the transmitter 150, receiver 170, power amplifier 180, and the power amplifier control element 185. It should be noted that, for simplicity, only the basic components of the portable transceiver 100 are illustrated herein. The control signals provided by the baseband subsystem 110 control the various components within the portable transceiver 100. Further, the function of the transmitter 150 and the receiver 170 may be integrated into a transceiver.

The power amplifier control element 185 generates a power amplifier (PA) power control signal. The power control signal controls the power output of the power amplifier 180 based on various inputs. For example, in an embodiment, a closed power control loop may influence the power output of the power amplifier 180. In another embodiment, an open power control loop may influence the power output of the power amplifier 180. For example, in an embodiment, a signal received by a base station with which the portable communication device 100 is communicating may issue a power control signal. In other embodiments, the baseband subsystem 110 may provide a power profile signal to the power amplifier control element 185.

If portions of the system and method for dynamically improving call connection are implemented in software that is executed by the microprocessor 120, the memory 122 will also include power control level (PCL) software 155 a first register 156 and a second register 157. The first register 157 can be configured to contain a threshold value for the level of the received signal, RXLEV_THRESHOLD, and the register 157 can be configured to contain a value of a power boost offset, referred to as PWR_BOOST_OFFSET, and a value for power decrease offset, PWR_DECREASE OFFSET, as will be described below. The power control level (PCL) software 155 comprises one or more executable code segments that can be stored in the memory and executed in the microprocessor 120. Alternatively, the functionality of the power control level (PCL) software 155 can be coded into an ASIC (not shown) or can be executed by an FPGA (not shown), or another device. Because the memory 122 can be rewritable and because an FPGA is reprogrammable, updates to the power control level (PCL) software 155 can be remotely sent to and saved in the portable transceiver 100 when implemented using either of these methodologies.

Baseband subsystem 110 also includes analog-to-digital converter (ADC) 134 and a digital-to-analog converters (DAC) 136. In this example, the DAC 136 generates the in-phase (I) and quadrature-phase (Q) signals 140 that are applied to a modulator (not shown) in the transmitter 150. The ADC 134 and the DAC 136 also communicate with microprocessor 120, memory 122, analog circuitry 124 and DSP 126 via bus 128. The DAC 136 converts the digital communication information within baseband subsystem 110 into an analog signal for transmission by the transmitter 150. The connection 140, while shown as two directed arrows, includes the information that is to be transmitted by the transmitter 150 after conversion from the digital domain to the analog domain.

The transmitter 150 includes a modulator (not shown), which modulates the analog information on connection 140 and provides a modulated signal to an upconverter (not shown). The transmitter 150 transforms the modulated signal on to an appropriate transmit frequency and provides the upconverted signal to a power amplifier 180 via connection 184. The power amplifier 180 amplifies the signal to an appropriate power level for the system in which the portable transceiver 100 is designed to operate.

Details of the transmitter 150 have been omitted, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed. For example, when the power amplifier module is used in a constant-amplitude, phase (or frequency) modulation application such as the global system for mobile communications (GSM), the phase modulated information is provided by a modulator within the transmitter 150. When the power amplifier module is used in an application requiring both phase and amplitude modulation such as, for example, extended data rates for GSM evolution, referred to as EDGE, the Cartesian in-phase (I) and quadrature (Q) components contain both amplitude and phase information.

The power amplifier 180 supplies the amplified signal via connection 156 to a front end module 162. The front end module comprises an antenna system interface that may include, for example, a diplexer having a filter pair that allows simultaneous passage of both transmit signals and receive signals, as known to those having ordinary skill in the art. The transmit signal is supplied from the front end module 162 to the antenna 160.

The power amplifier control element 185 determines the appropriate power level at which the power amplifier 180 operates to amplify the transmit signal.

A signal received by an antenna 160 is directed from the front end module 162 to the receiver 170. The receiver 170 includes various components to downconvert, filter, demodulate and recover a data signal from a received signal, as known to those skilled in the art. If implemented using a direct conversion receiver (DCR), the receiver 170 converts the received signal from an RF level to a baseband level (DC), or a near-baseband level (~100 kHz). Alternatively, the received RF signal may be downconverted to an intermediate frequency (IF) signal, depending on the system architecture. The recovered transmitted information is supplied via connection 186 to the ADC 134. The ADC 134 converts these analog signals to a digital signal at baseband frequency and transfers the signal via bus 128 to DSP 126 for further processing.

In an embodiment in accordance with the invention, the receiver 170 includes a receive level (RXLEV) detect element 135. The RXLEV element 135 develops a signal representative of the power level of the signal received from a base station with which the portable communication device is operating. The RXLEV signal can be used to determine whether the portable communication device 100 is in a disadvantaged position with respect to the base station. Based on the level of the RXLEV signal, the PCL software 155 can determine whether the power amplifier should transmit maximum power during a RACH transmission, or whether the power amplifier should transmit slightly less than maximum power to conserve power or transmit slightly more than maximum power to ensure reliable call establishment, as will be described below. While each RACH transmission occurs at a maximum nominal power (power level 5 for a class 4 mobile station, as mentioned above), the power of the RACH transmission can be slightly modulated, as will be described below. The slight change in the output power cannot violate the GSM recommended mask requirement.

In an embodiment, the RXLEV signal is made available to the baseband subsystem 110 so that a power control signal can be developed in the baseband subsystem 110 and sent to the power amplifier control element 185. The power control signal is referred to as MAXDAC because it represents a maximum digital-to-analog converter value that corresponds to the maximum power that can be transmitted by the power amplifier 180.

In an alternative embodiment, the RXLEV signal remains on the RF chip and is made available directly to the power amplifier control element 185.

Figure 2:
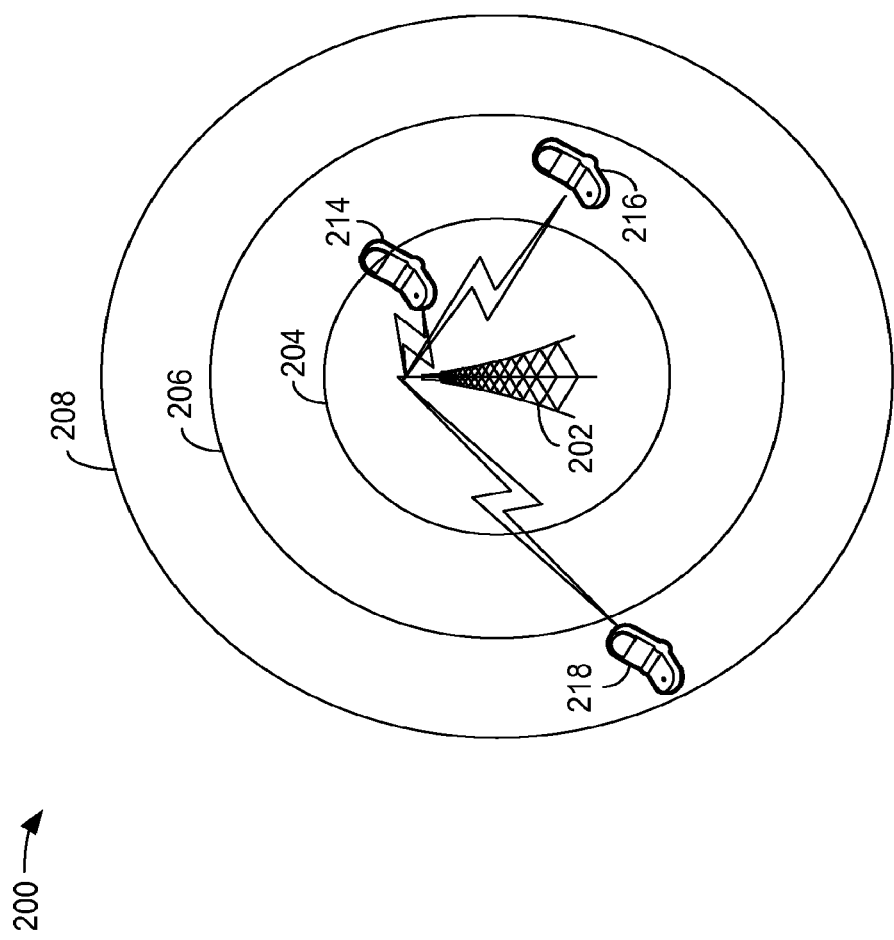
FIG. 2 is a schematic diagram illustrating a communication environment in which the system and method for dynamically improving call connection operates.

FIG. 2 is a schematic diagram illustrating a communication environment 200 in which the system and method for dynamically improving call connection operates. The communication environment 200 includes a base station 202, which is in bi-directional radio frequency (RF) communication with a plurality of portable communication devices 214, 216 and 218. The portable communication devices 214, 216 and 218 are similar to the portable communication device 100 described in FIG. 1. Typically, the base station will be in RF communication with many portable communication devices. However, three portable communication devices are shown in FIG. 2 for simplicity of illustration. The portable communication devices 214, 216 and 218 are illustrated as being different distances from the base station 200. A first distance is illustrated using the reference numeral 204, a second distance is illustrated using the reference numeral 206, and a third distance is illustrated using the reference numeral 208.

In an exemplary embodiment, if a portable communication device, such as the portable communication device 214, is physically close to the base station 202, and preferably at or within the distance 204, then the amount of power transmitted by the portable communication device 214 to the base station 202 can be relatively lower than, for example, the amount of power transmitted by a portable communication device that is farther away from the base station 202 than the portable communication device 214.

In this example, the portable communication device 216 is farther from the base station 202 than is the portable communication device 214. Similarly, the portable communication device 218 is farther away from the base station 202 than is the portable communication device 216. In an example embodiment of the system and method for dynamically improving call connection, while each portable communication device 214, 216 and 218 will send a maximum power RACH signal when it wishes to communicate with the base station 202, there may be situations in which a slightly higher power RACH signal, or a slightly lower power RACH signal is warranted. For example, because the portable communication device 218 is relatively far from the base station 202, it may be desirable to cause the portable communication device 218 to send a RACH signal at a slightly higher power. Similarly, because the portable communication device 214 is relatively close to the base station 202, it may be desirable to cause the portable communication device 214 to send a RACH signal at a slightly lower power.

The receiver (not shown, but refer to FIG. 1) within each portable communication device includes a receive level detect element 135. The portable communication device 216 will be referred to here for simplicity. The receive level detect element 135 provides a receive level reference signal, referred to as RXLEV, that is indicative of the signal strength of the signal received from the base station 202 by the portable communication device 216. The strength of the signal received from the base station 202 is indicative of the condition of the radio frequency (RF) communication environment between the base station 202 and the portable communication device 216, and is therefore useful as an indicator of the amount of transmit power that should be expended by the portable communication device 216 to ensure a reliable two-way RF connection to the base station 202. Because the portable communication device 216 is located a nominal distance from the base station 202, a maximum power RACH signal is likely to yield acceptable results. In this example, a max power RACH signal is said to be transmitted with a nominal power output, which is power level 5 for a class 4 mobile station, from the power amplifier 180.

However, in a case such as that illustrated by the location of the portable communication device 214 relative to the base station 202, a receive level detect element 135 located in the portable communication device 214 would likely indicate a very strong receive signal due to the small physical distance between the base station 202 and the portable communication device 214. In such an instance, the portable communication device 214 can transmit a max power RACH signal using slightly less power and still likely achieve satisfactory communication with the base station 202, as will be described below.

In a case such as that illustrated by the location of the portable communication device 218, a receive level detect element 135 located in the portable communication device 218 would likely indicate a relatively weak receive signal due to the large distance between the base station 202 and the portable communication device 218. In such an instance, the portable communication device 218 can transmit a max power RACH signal with slightly more than maximum nominal power, which is power level 5 for a class 4 mobile station, in order to achieve satisfactory communication with the base station 202.

It should be mentioned that physical distance between the base station 202 and a portable communication device is used as an example to illustrate one factor that may influence the level of a signal received at a portable communication device and the general condition of a two-way radio frequency communication channel between a base station and a mobile station. However, distance is not the only factor that determines the level of a signal received at a portable communication device. Many factors influence the strength of a signal received at a portable communication device. Factors include, for example, the terrain, the presence of obstacles, such as buildings, etc., the number and location of other portable communication devices, etc. All such factors are contemplated herein.

In accordance with an embodiment of the system and method for improving call connection dynamically, the available receive level (RXLEV) information available in the portable communication device is used as a metric to determine whether the portable communication device is in a disadvantaged position with respect to the base station. If the portable communication device is in a disadvantaged position with respect to the base station, then the transmit power level of the random access burst is boosted by an offset amount. For example, the offset amount can be denoted as PWR_BOOST_OFFSET. The power control level software 155 (FIG. 1) can measure the RXLEV against a threshold to determine whether the portable communication device is in a disadvantaged position and, if the portable communication device is indeed in a disadvantaged position, the power control level software 155 can boost the power level of the random access (RACH) burst. In this manner, a higher likelihood of establishing a call connection on the first RACH signal is possible.

Figure 3:
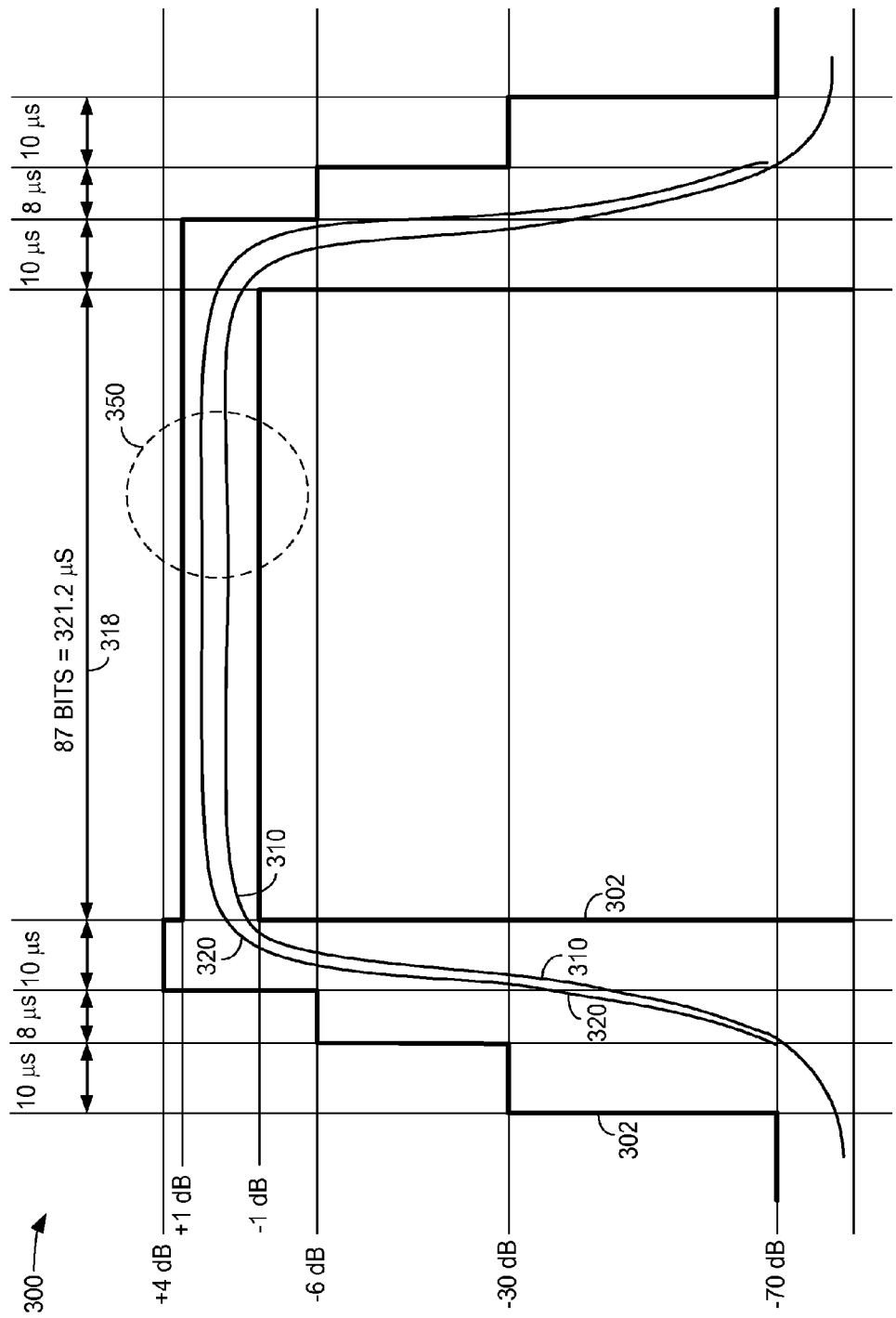
FIG. 3 is a graphical representation of an output burst including a description of the operation of the system and method for dynamically improving call connection.

FIG. 3 is a graphical representation of the power output of the power amplifier during a typical RACH burst 300. The curve 310 illustrates the desired power output of the power amplifier 180 during a RACH transmission. A transmit spectrum mask 302 defines the power and time parameters within which the curve 310 must remain to comply with regulatory requirements. As shown in FIG. 3, the curve 310 indicates that output power remains below −70 dB until the beginning of the burst 300. In this example, the portion of the burst in which the RACH request is transmitted is 87 bits in duration, which corresponds to 321.2 µs, and is indicated using reference numeral 318. The ramp up of the curve 310 occurs in the 18 µs preceding the beginning of the period 318 and the ramp down of the curve 310 occurs in the 18 µs after the period 318.

The curve 320 indicates a desired power output of the power amplifier 180 after being boosted by the power offset described above. In accordance with an embodiment of the system and method for dynamically improving call connection, the power output of the power amplifier 180 is boosted during a RACH burst if the level of the signal received from the base station 202, indicated using RXLEV, is below a predetermined threshold. Alternatively, the power output of the power amplifier 180 can be reduced during a RACH burst if the level of the signal received from the base station 202, indicated using RXLEV, is above a predetermined threshold. In an embodiment, a max power RACH burst can be modulated in the approximate range up to +1 to −1 dB and still remain within the mask 302.

RXLEV is the indication of the signal strength and is calculated as follows. RXLEV=Measured Signal level+110. The portable communication device is considered to be in a disadvantaged location when the measured signal level at the mobile station antenna is at or below −90 dBm. This translates to a value of RXLEV between 0 and 20.

In an exemplary embodiment, the relationship between RXLEV and the signal level is given in Table 1.

TABLE 1

| RXLEV | Signal Level |
|---|---|
| 0 | −110 dBm |
| 1 | −109 dBm |
| 2 | −108 dBm |

TABLE 1-continued

| RXLEV | Signal Level |
|---|---|
| 3 | −107 dBm |
| 4 | −106 dBm |
| 5 | −105 dBm |
| 6 | −104 dBm |
| 7 | −103 dBm |
| 8 | −102 dBm |
| 9 | −101 dBm |
| 10 | −100 dBm |
| 11 | −99 dBm |
| 12 | −98 dBm |
| 13 | −97 dBm |
| 14 | −96 dBm |
| 15 | −95 dBm |
| 16 | −94 dBm |
| 17 | −93 dBm |
| 18 | −92 dBm |
| 19 | −91 dBm |
| 20 | −90 dBm |
| 21 | −89 dBm |
| ... | |
| 40 | −70 dBm |

When the level of the RXLEV signal indicates that the portable communication device is in a disadvantaged location, the transmit power is raised by an amount equal to PWR_BOOST_OFFSET.

In an embodiment, the power control level software 155 (FIG. 1) can be implemented using two registers. A register 156 (FIG. 1) can contain a value for the receive level threshold, RXLEV_THRESHOLD, which in this example is 20 (corresponding to −90 dBm), but can be any value depending on implementation. A second register 157 (FIG. 1) can contain a value for the value PWR_BOOST_OFFSET, which can be in the same format as the signal MAXDAC. If the value of RXLEV measured in the receiver 170 (FIG. 1) is less than RXLEV_THRESHOLD, then the value of PWR_BOOST_OFFSET is added to the MAXDAC value that will be used to generate the maximum power for the RACH burst. However, if the level of RXLEV is greater than or equal to the threshold RXLEV_THRESHOLD, no power boost is added to the value of MAXDAC that will be used for the RACH burst. A third register 158 can contain the information related to the low threshold, RXLEV_THRESHOLD_LOW, and the high threshold, RXLEV_THRESHOLD_HIGH, to be described below.

In an embodiment, the default value of the RXLEV_THRESHOLD can be 20, but can be changed at power on reset (POR) programming. In an embodiment, the default value of PWR_BOOST_OFFSET=DAC setting count for 0.5 dB. For example, when the portable communication device is calibrated, power amplifier output power is equated to DAC value. In an embodiment, the PWR_BOOST_OFFSET value corresponds to approximately 0.5 dB, which corresponds to the DAC count that would be equated with 0.5 dB for the particular power amplifier. The value of PWR_BOOST_OFFSET can be changed at power on reset programming. To disable the additional power boost, the value of PWR_BOOST_OFFSET should be programmed to 0 and/or RXLEV_THRESHOLD should be programmed a negative integer value. To disable the power decrease, the value of PWR_DECREASE_OFFSET should be programmed to 0 and/or RXLEV_THRESHOLD should be programmed a negative integer value. Both RXLEV_THRESHOLD, PWR_BOOST_OFFSET and PWR_DECREASE_OFFSET can be adjusted and programmed for best performance.

Figure 4:
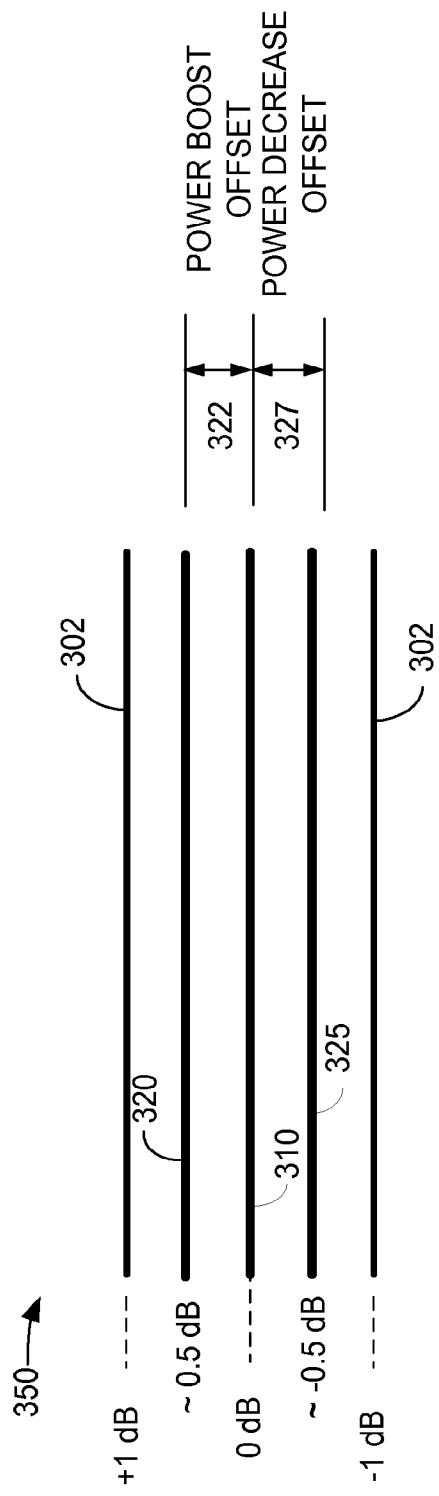
FIG. 4 is a graphical representation of a portion of the output burst of FIG. 3, illustrating the operation of the system and method for dynamically improving call connection.

FIG. 4 is a graphical representation of a portion of the output burst of FIG. 3, illustrating the operation of the system and method for dynamically improving call connection.

A portion of the spectrum mask 302 is shown for reference. The 0 dB line represents a nominal maximum power output of the power amplifier during the RACH burst. The actual power output is determined when the power amplifier is calibrated. Therefore, the curve 310 will coincide with the 0 dB line, regardless of the actual power output. The curve 310 represents the max power output of the power amplifier during a nominal max power RACH burst, and can be located anywhere within the mask 302, i.e., at a power of 33 dBm, +/−1 dB, for a class 4 mobile station. The curve 310 represents the output of the power amplifier under a normal, non-power boosted RACH burst. The curve 320 illustrates the actual power output of the power amplifier 180 when the value, PWR_BOOST_OFFSET 322 is added to the output power. The curve 325 illustrates the actual power output of the power amplifier 180 when the value, PWR_DECREASE_OFFSET 327 is subtracted from the output power. The output power of the power amplifier 180 can be increased or decreased by a small value between −1 dB and +1 dB, depending on factors such as the actual maximum power that the power amplifier is able to transmit, the amount of power available in the power amplifier (i.e., power amplifier headroom), and other factors. For example, the output power of the power amplifier 180 is increased by the value corresponding to PWR_RBOOST_OFFSET when the value of the RXLEV signal is below the threshold RXLEV_THRESHOLD, indicating that the portable communication device is in a weak signal reception area with respect to the base station 202. In an embodiment, the power can be nominally increased by approximately 0.5 dB. However, the boosted power output still remains within the mask 302. Similarly, the output power of the power amplifier 180 is decreased by the value corresponding to PWR_DECREASE_OFFSET when the value of the RXLEV signal is above the threshold RXLEV_THRESHOLD, indicating that the portable communication device is in a strong signal reception area with respect to the base station 202. In an embodiment, the power can be nominally decreased by approximately 0.5 dB. However, the reduced power output still remains within the mask 302.

In an embodiment, the baseband subsystem 110 computes the setting of the maximum DAC (MAXDAC) value for the power control level and also programs the settings to the RF/MSD subsystem 130. The RFIC uses the MAXDAC to generate the power profile for the actual transmit burst. However, in an alternative embodiment, the computation of the value MAXDAC for the power control level and the generation of the power profile are done in the RF/MSD subsystem 130. In such an embodiment, the baseband subsystem 110 may program the power control level, but the RF/MSD subsystem 130 provides the MAXDAC value directly from the receive level detect element 135 to the power amplifier control element 185.

Figure 5:
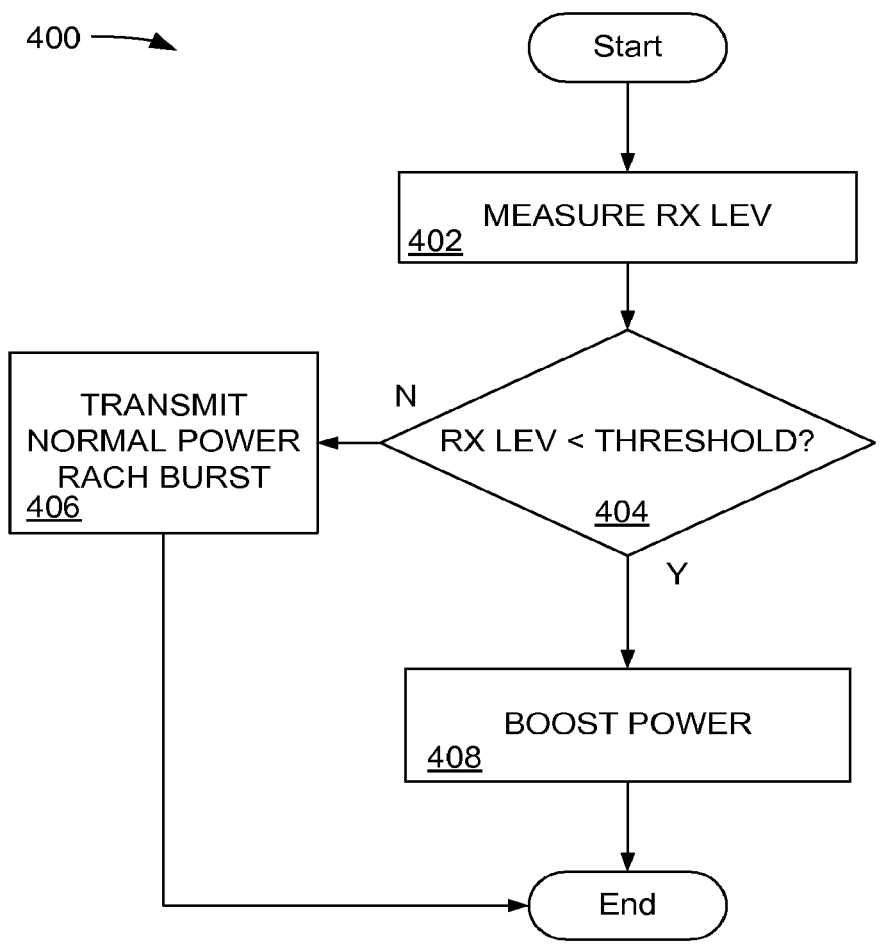
FIG. 5 is a flow chart illustrating the operation of an embodiment of a method for dynamically improving call connection.

FIG. 5 is a flow chart illustrating the operation of an embodiment of the method for dynamically improving call connection. The blocks in the flowchart can be performed in the order shown, out of the order shown, or can be performed in parallel. In block 402, the level of the signal received from a base station 202 is measured by the receive level detect element 135. The receive level detect element 135 then generates the RXLEV signal.

In block 404, the value of the RXLEV signal is compared against a receive level threshold signal, RXLEV_THRESHOLD. If, it is determined in block 404 that the value of the receive level signal RXLEV is greater than the threshold, a nominal (maximum) power RACH burst is initiated in block 406 and the process ends.

If however, in block 404 it is determined that the value of the receive level signal RXLEV is less than the threshold, then, in block 408, the output power of the power amplifier 180 is increased by an amount between −1 dB and +1 dB (referred to as PWR_BOOST_OFFSET) and an increased power RACH burst is transmitted. In an embodiment, the power can be increased by approximately 0.5 dB. The increased-power RACH burst has a higher likelihood of being received at the base station than a normal RACH transmission, thereby improving the chance of call establishment using a single RACH burst. The process then ends.

Figure 6:
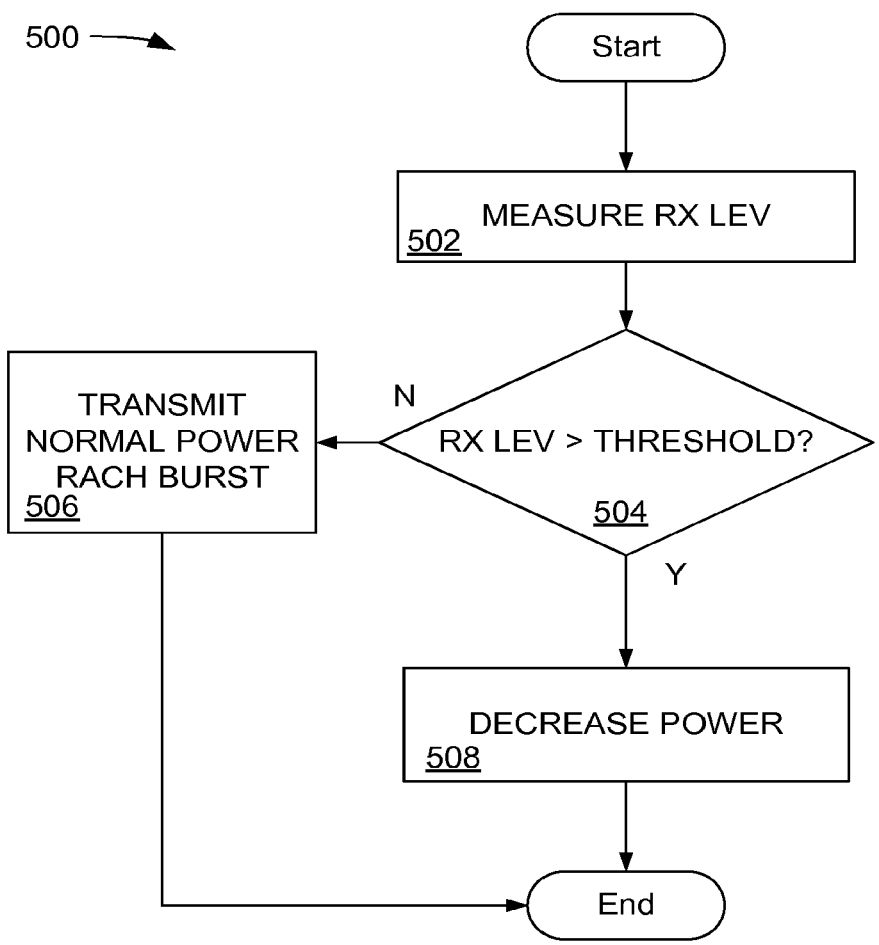
FIG. 6 is a flow chart illustrating the operation of an alternative embodiment of a method for dynamically improving call connection.

FIG. 6 is a flow chart illustrating the operation of an alternative embodiment of the method for dynamically improving call connection. The blocks in the flowchart can be performed in the order shown, out of the order shown, or can be performed in parallel. In block 502, the level of the signal received from a base station 202 is measured by the receive level detect element 135. The receive level detect element 135 then generates the RXLEV signal.

In block 504, the value of the RXLEV signal is compared against a receive level threshold signal, RXLEV_THRESHOLD. If, it is determined in block 504 that the value of the receive level signal RXLEV is less than the threshold, a nominal (maximum) power RACH burst is initiated in block 506 and the process ends.

If however, in block 504 it is determined that the value of the receive level signal RXLEV is greater than the threshold, then, in block 508, the output power of the power amplifier 180 is decreased by an amount between −1 dB and +1 dB (referred to as PWR_DECREASE_OFFSET) and an decreased power RACH burst is transmitted. In an embodiment, the power can be decreased by approximately 0.5 dB. The decreased-power RACH burst reduces power consumption in a situation in which a reduced power RACH burst is likely to be adequately received at the base station. The process then ends.

Figure 7:
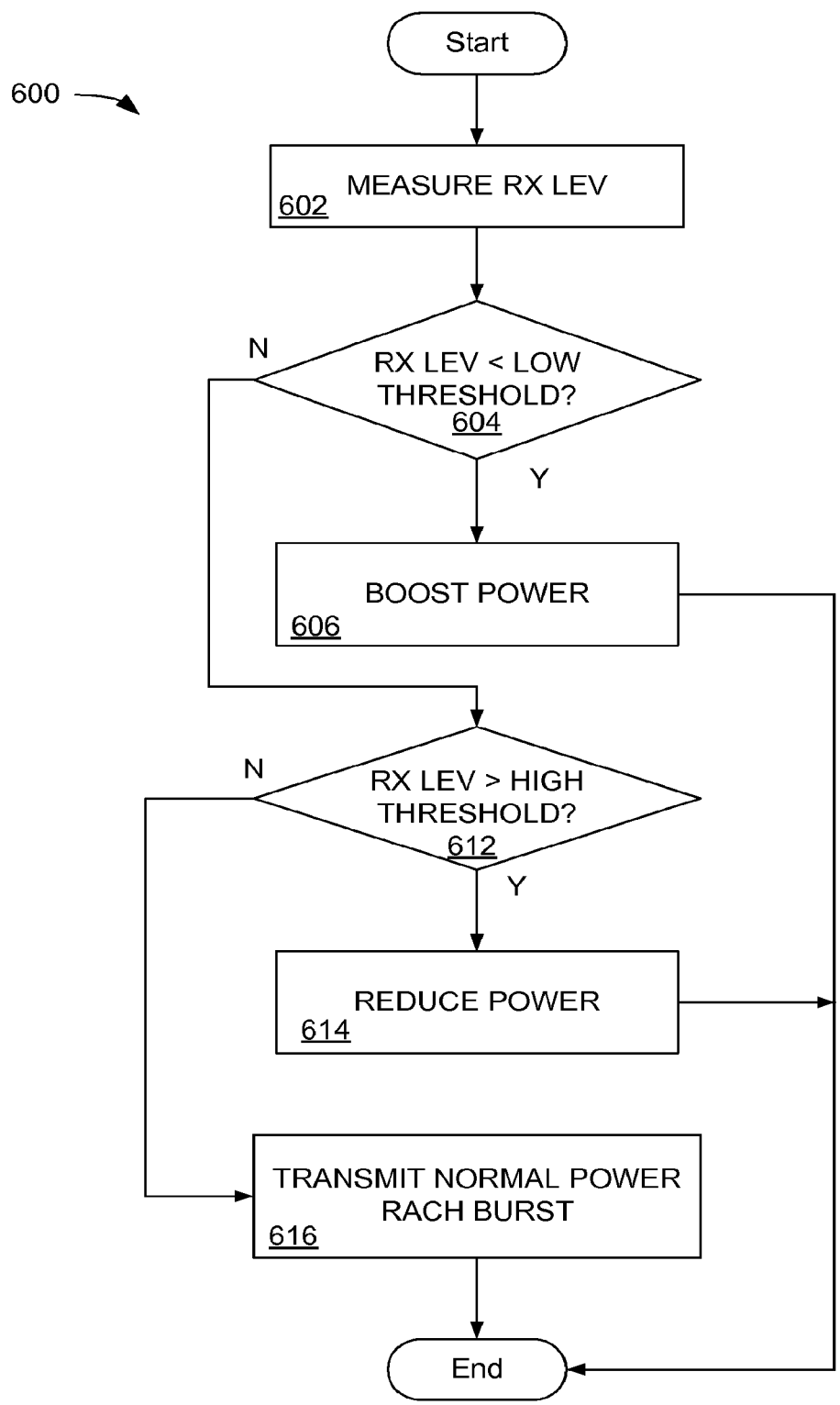
FIG. 7 is a flow chart illustrating the operation of another alternative embodiment of the method for dynamically improving call connection.

FIG. 7 is a flow chart illustrating the operation of another alternative embodiment of the method for dynamically improving call connection. The blocks in the flowchart can be performed in the order shown, out of the order shown, or can be performed in parallel. In block 602, the level of the signal received from a base station 202 is measured by the receive level detect element 135. The receive level detect element 135 then generates the RXLEV signal.

In block 604, the value of the RXLEV signal is compared against a receive level threshold signal, RXLEV_THRESHOLD_LOW. If, in block 604 it is determined that the value of the receive level signal RXLEV is less than the low threshold, then, in block 606, the output power of the power amplifier 180 is increased by the amount associated with the signal, PWR_BOOST_OFFSET, and an increased power RACH burst is transmitted, as described above. The increased-power RACH burst has a higher likelihood of being received at the base station, thereby improving the chance of call establishment using a single RACH burst. The process then ends.

If, however, it is determined in block 604 that the value of the receive level signal RXLEV is greater than the low threshold, then, in block 612, it is determined whether the value of the receive signal level RXLEV is greater than a high threshold, RXLEV_THRESHOLD_HIGH. If, in block 612 it is determined that the value of the receive signal RXLEV is higher than the value of the high threshold, then, in block 614 the transmit power is reduced by the amount associated with the signal, PWR_DECREASE_OFFSET, within the range of −1 dB and +1 dB, but still remaining within the mask 302 (FIG. 4) and a reduced power RACH burst is transmitted. In an embodiment, the power can be reduced by approximately 0.5 dB. The process then ends.

If, in block 612 it is determined that the value of the receive signal RXLEV is lower than the value of the high threshold, then, in block 616 a normal RACH burst is transmitted. The process then ends. In this manner, a window is created between the low threshold, RXLEV_THRESHOLD_LOW, and the high threshold, RXLEV_THRESHOLD_HIGH, thus allowing a three-case decision process to send a reduced power RACH burst, a normal power RACH burst, or an increased power RACH burst, depending on the value of the receive signal as indicated by the signal RXLEV. For example, for a receive signal between −90 dBm (RXLEV=20) and −70 dBm (RXLEV=40), as a threshold window, a nominal max power RACH burst is transmitted. For a receive signal higher than −70 dBm (RXLEV>40), the RACH power is adjusted lower by the offset value PWR_DECREASE_OFFSET; and for a receive signal lower than −90 dBm (RXLEV<20), the RACH power is adjusted higher by the offset value PWR_BOOST_OFFSET.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for controlling a power amplifier of a portable communication device, the method comprising:
   determining strength of a received radio-frequency (RF) signal;
   generating a receive reference signal representative of the strength of the received RF signal;
   comparing the receive reference signal with a threshold value; and
   generating, within the portable communication device, a control signal for the power amplifier with a digital-to-analog converter (DAC) based on the comparison, the DAC configured to generate a maximum DAC (MAXDAC) value as part of the control signal, the generating of the control signal being performed in a baseband subsystem, the control signal representative of an output power level of the power amplifier during a random access channel signal transmission, the control signal being configured so that the output power level is adjusted based on the comparison, the MAXDAC configured to allow generation of a power profile for the random access channel signal transmission.

2. The method of claim 1 wherein the control signal is configured so that the output power level is increased if the receive reference signal is below the threshold value.

3. The method of claim 1 wherein the control signal is configured so that the output power level is decreased if the receive reference signal is above the threshold value.

4. The method of claim 1 wherein the adjusting of the output power level includes an adjustment by a selected offset amount.

5. The method of claim 4 wherein the selected offset amount is between −1 dB and +1 dB.

6. The method of claim 1 wherein the generating of the control signal is performed in a radio frequency (RF) circuit.

7. The method of claim 1 wherein the strength of the received RF signal includes a power level of the received RF signal.

8. The method of claim 1 wherein the generating of the control signal includes generating an analog representation of a digital control signal representative of the output power level.

9. The method of claim 8 wherein the analog representation includes a maximum value of the output power level.

10. A system for controlling a power amplifier of a portable communication device, the system comprising:
a receiver having a receive level detect element configured to generate a receive reference signal representative of strength of a received signal;
a control component configured to generate a control signal based on comparison of the receive reference signal with a threshold value, the control component being part of a baseband subsystem and including a digital-to-analog converter (DAC), the DAC configured to generate a maximum DAC (MAXDAC) value as part of the control signal; and
a power amplifier controller configured to receive the control signal and configure a transmit signal having an output power level during a random access channel signal transmission, the control signal being configured so that the output power level is adjusted based on the comparison, the MAXDAC configured to allow the power amplifier controller to generate a power profile for the random access channel signal transmission.

11. The system of claim 10 wherein the control component is part of a radio frequency (RF) subsystem.

12. A method for controlling a power amplifier of a portable communication device, the method comprising:
determining strength of a received radio-frequency (RF) signal;
generating a receive reference signal representative of the strength of the received RF signal;
comparing the receive reference signal with a threshold value;
generating, within the portable communication device, a control signal with a digital-to-analog converter (DAC) based on the comparison, the DAC configured to generate a maximum DAC (MAXDAC) value as part of the control signal, the generating of the control signal being performed in a baseband subsystem; and
adjusting an output power level of the power amplifier during a random access channel signal transmission based on the control signal, the control signal being configured so that the output power level is adjusted based on the comparison, the MAXDAC configured to allow generation of a power profile for the random access channel signal transmission.

13. The method of claim 12 wherein adjusting the output power level of the power amplifier includes increasing the output power level if the receive reference signal is below the threshold value.

14. The method of claim 12 wherein adjusting the output power level of the power amplifier includes decreasing the output power level if the receive reference signal is above the threshold value.

15. The method of claim 12 wherein the adjusting of the output power level includes an adjustment by a selected offset amount.

16. The method of claim 15 wherein the selected offset amount is between −1 dB and +1 dB.

17. The method of claim 12 wherein the generating of the control signal is performed in a radio frequency (RF) circuit.

18. The method of claim 12 wherein the strength of the received RF signal includes a power level of the received RF signal.

19. The method of claim 12 wherein the generating of the control signal includes generating an analog representation of a digital control signal representative of the output power level.

20. The method of claim 19 wherein the analog representation includes a maximum value of the output power level.

* * * * *